US007742306B2

(12) United States Patent
Shuai et al.

(10) Patent No.: US 7,742,306 B2
(45) Date of Patent: Jun. 22, 2010

(54) LED LAMP WITH A HEAT SINK ASSEMBLY

(75) Inventors: Chun-Jiang Shuai, Shenzhen (CN); Guang Yu, Shenzhen (CN); Zhi-Yong Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 154 days.

(21) Appl. No.: 12/041,679

(22) Filed: Mar. 4, 2008

(65) Prior Publication Data

US 2009/0147522 A1 Jun. 11, 2009

(30) Foreign Application Priority Data

Dec. 7, 2007 (CN) ........................ 2007 1 0124922

(51) Int. Cl.
*H05K 7/20* (2006.01)

(52) U.S. Cl. ........................ 361/710; 361/700; 362/234; 362/249.02; 362/294; 165/80.3; 165/104.33

(58) Field of Classification Search ................. 361/699, 361/700, 701, 704, 709, 715, 717, 720
See application file for complete search history.

(56) References Cited

U.S. PATENT DOCUMENTS

| | | | | |
|---|---|---|---|---|
| 5,229,915 | A * | 7/1993 | Ishibashi et al. | 361/699 |
| 5,402,160 | A * | 3/1995 | Kadowaki et al. | 347/18 |
| 6,880,952 | B2 * | 4/2005 | Kiraly et al. | 362/218 |
| 6,882,532 | B2 * | 4/2005 | Chen et al. | 361/690 |
| 7,028,758 | B2 * | 4/2006 | Sheng et al. | 165/104.21 |
| 7,303,315 | B2 * | 12/2007 | Ouderkirk et al. | 362/294 |
| 7,382,616 | B2 * | 6/2008 | Stefanoski | 361/698 |
| 2004/0179335 | A1 | 9/2004 | Chen et al. | |
| 2007/0201232 | A1 | 8/2007 | Chen | |
| 2008/0150126 | A1 * | 6/2008 | Zhou et al. | 257/712 |

FOREIGN PATENT DOCUMENTS

| | | | |
|---|---|---|---|
| CN | 1705112 | A | 12/2005 |
| CN | 1741291 | A | 3/2006 |
| CN | 1967440 | A | 5/2007 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

An LED lamp includes a first heat sink, a pair of second heat sinks arranged at two opposite sides of the first heat sink, a plurality of heat pipes connecting the first heat sink to the pair of second heat sinks, and an LED module mounted on the first heat sink. With the help of good heat conducting capability of the heat pipes, heat generated by LEDs of the LED module can be conducted to the first heat sink and the pair of second heat sinks rapidly, which then dissipate the heat to the ambient air. Each second heat sink consists of a plurality of sheets defining a plurality of gaps therebetween; the gaps extend through top and bottom of each second heat sink. Each second heat sink has a lower portion below a bottom surface of the first heat sink.

11 Claims, 5 Drawing Sheets

LED LAMP WITH A HEAT SINK ASSEMBLY

BACKGROUND OF THE INVENTION

1. Field of the Invention

The present invention relates to a light emitting diode (LED) lamp, and more particularly to an LED lamp incorporating a heat sink assembly, wherein the heat sink assembly has a plurality of heat pipes for improving heat dissipation of the LED lamp.

2. Description of Related Art

As an energy-efficient light, an LED lamp has a trend of substituting for the fluorescent lamp for indoor lighting purpose; in order to increase the overall lighting brightness, a plurality of LEDs are often incorporated into a signal lamp, in which how to efficiently dissipate heat generated by the plurality of LEDs becomes a challenge.

Conventionally, an LED lamp used in street illumination comprises a planar metal board functioning as a heat sink and a plurality of LEDs mounted on a common side of the board. The LEDs are arranged in a matrix that comprises a plurality of mutually crossed rows and lines. When the LEDs are activated to lighten, heat generated by the LEDs is dispersed to ambient air via the board by natural air convection.

However, in order to achieve a higher lighting intensity, the LEDs are arranged into a number of crowded groups, whereby the heat generated by the LEDs is concentrated at discrete spots, which leads to an uneven heat distribution over the board. The conventional board is not able to dissipate locally-concentrated and unevenly-distributed heat timely and efficiently, whereby a heat accumulation occurs in the board easily. Such heat accumulation may cause the LEDs to overheat and to have an unstable operation or even a malfunction.

What is needed, therefore, is an LED lamp which can overcome the above-mentioned disadvantages.

SUMMARY OF THE INVENTION

An LED lamp includes a first heat sink, a pair of second heat sinks arranged at two opposite sides of the first heat sink to sandwich the first heat sink therebetween, a plurality of heat pipes connecting the first heat sink to the pair of second heat sinks, and an LED module mounted on the first heat sink. The LED module comprises a plurality of LEDs mounted in a matrix manner on a printed circuit board which engages a base of the first heat sink. Each of the heat pipes has a middle portion retained in the base of the first heat sink, and two opposite ends inserted into the pair of second heat sinks. With the help of good heat conducting capability of the heat pipes, heat generated by the LEDs of the LED module can be conducted to the first heat sink and the pair of second heat sinks rapidly and evenly, which then dissipate the heat to the ambient air with their large heat dissipating areas. Therefore, local concentrations and an uneven distribution of the heat on the base of the first heat sink are avoided. Each of the second heat sinks consists of a plurality of fins assembled together, wherein a gap is defined between two adjacent fins. Cool air can flow from a place below the second heat sink through the gap to a place above the second heat sink, thereby to efficiently and rapidly take heat away from the second heat sinks. Each of the second heat sinks has a lower portion below a bottom of the first heat sink.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
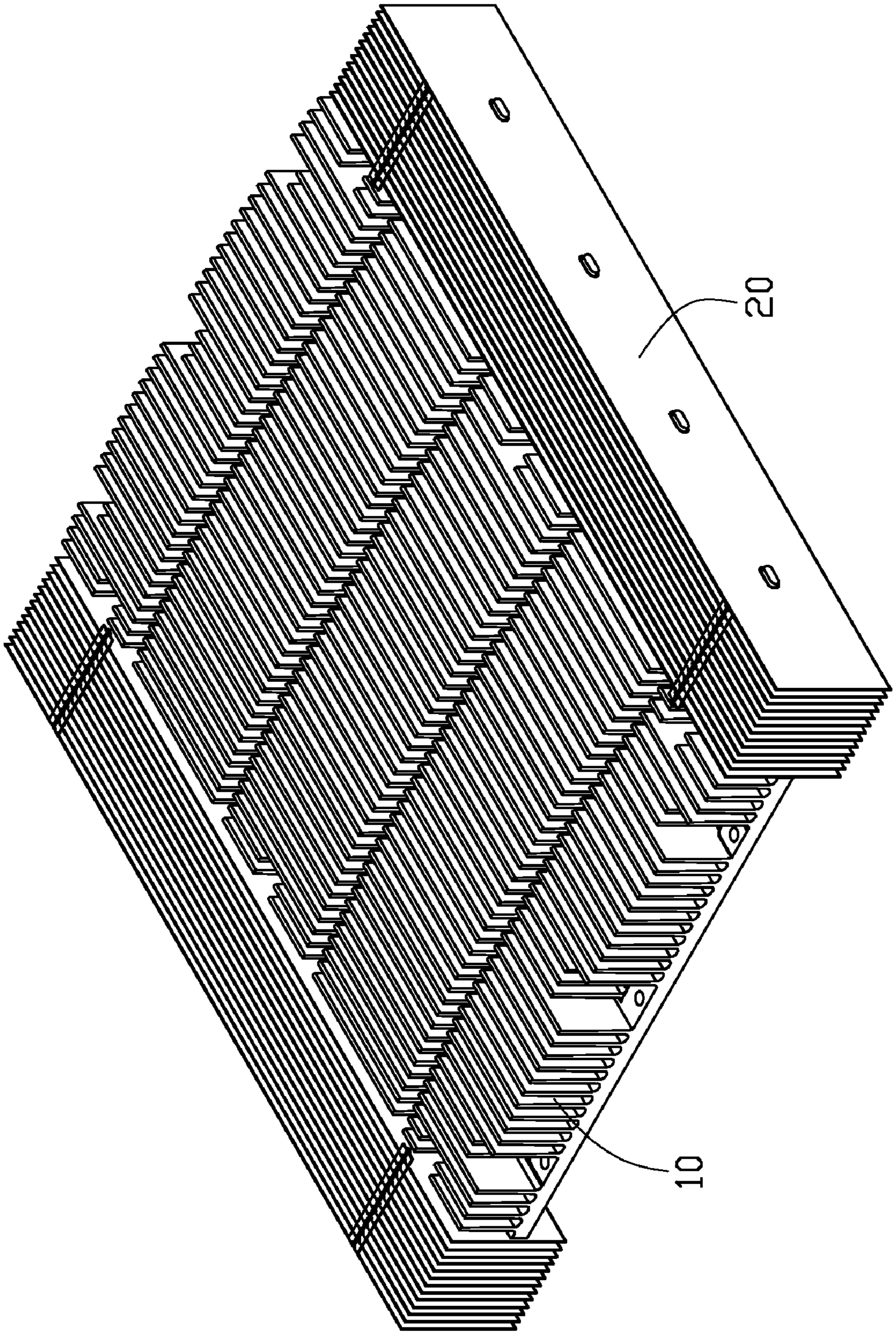
FIG. 1 is an assembled, isometric view of an LED lamp with a heat sink assembly in accordance with a preferred embodiment of the present invention.
Figure 2:
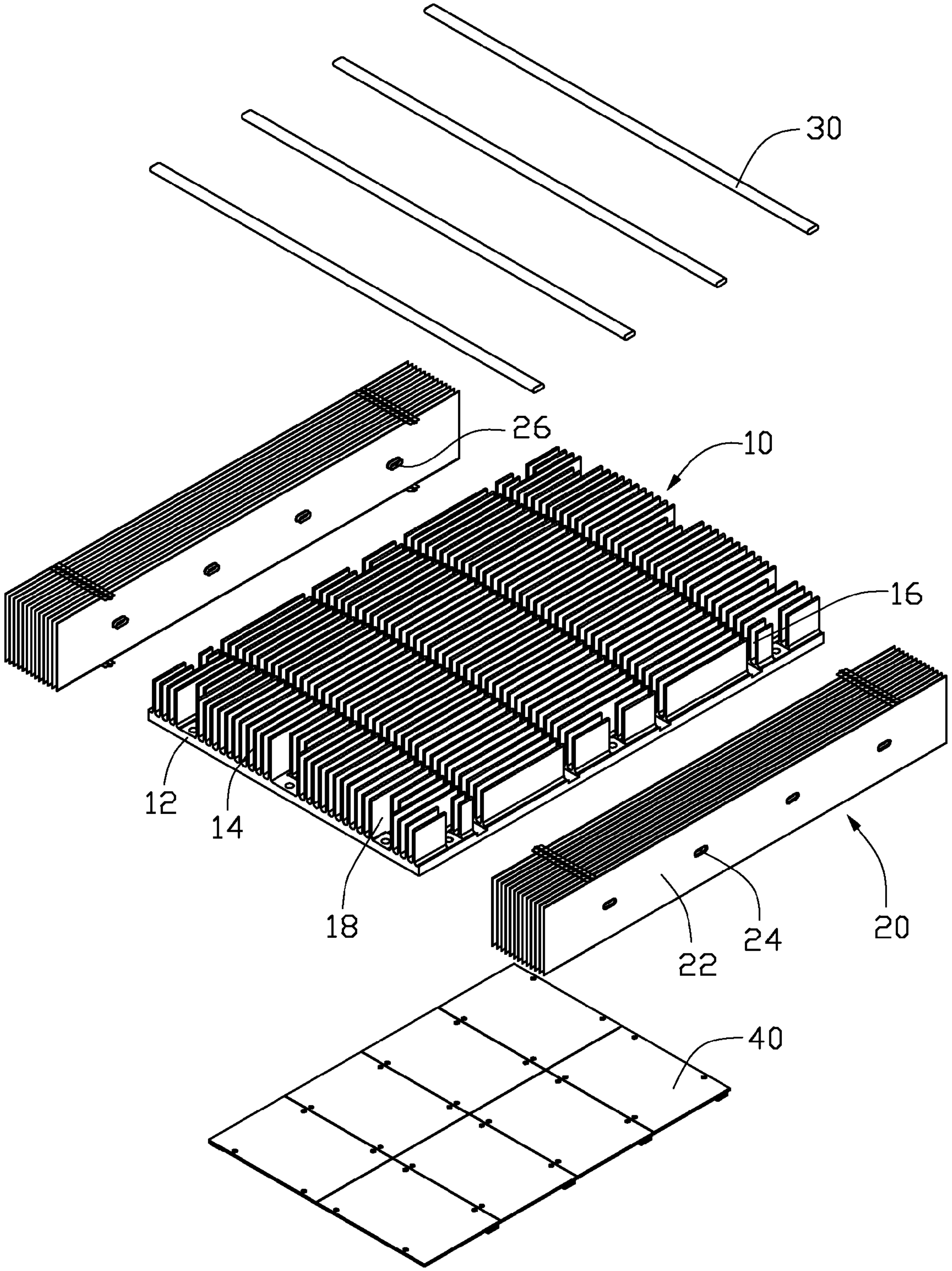
FIG. 2 is an exploded view of FIG. 1.
Figure 3:
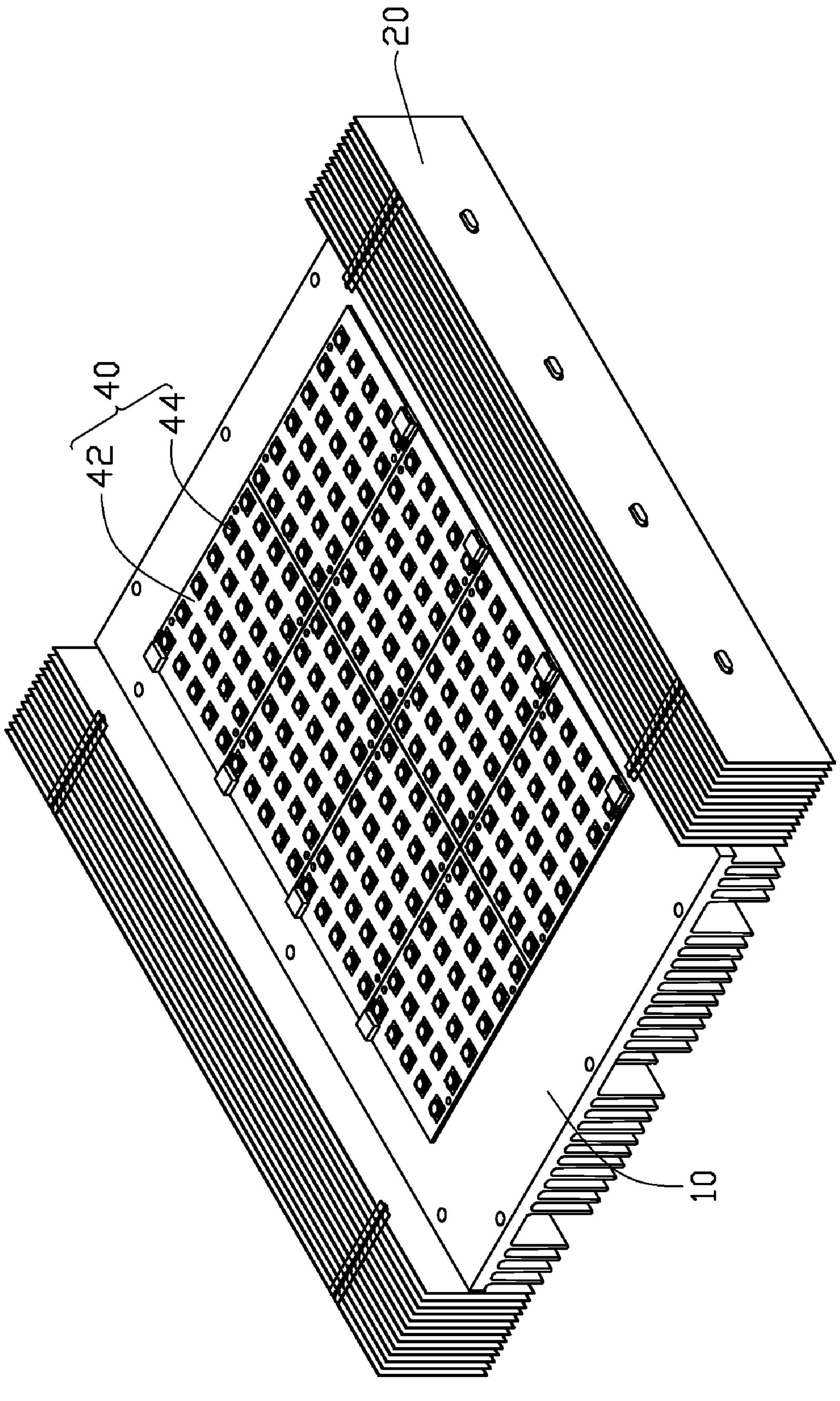
FIG. 3 is an inverted view of FIG. 1.

Referring to FIGS. 1-3, an LED lamp in accordance with a preferred embodiment of the present invention is used in such occasions that need high lighting intensity, such as street, gymnasium, court and so on.

The LED lamp comprises a heat sink 10, a pair of fin sets 20 disposed at two opposite sides (a front and a rear side) of the heat sink 10, four heat pipes 30 connecting the heat sink 10 to the pair of fin sets 20, and an LED module 40 mounted on a bottom side of the heat sink 10.

The heat sink 10 is made integrally of metal, such as copper, aluminum, or an alloy thereof. Preferably, the heat sink 10 is formed by aluminum extrusion. The heat sink 10 comprises a rectangular, planar base 12 and a plurality of fins 14 extending upwardly and perpendicularly from a top side of the base 12. Four channels 16 are defined across each of the plurality of fins 14, to thereby separate the plurality of fins 14 into five groups. Each of the four channels 16 is extended from tops of the plurality of fins 14 downwardly into the top side of the base 12, for securely receiving a corresponding one of the four heat pipes 30 therein. Corresponding parts of some of the plurality of fins 14 are truncated to form a plurality of recesses 18 around a periphery of the base 12 (see FIG. 4), for preventing the plurality of fins 14 from interfering with screws (not shown), which are used for extending through the base 12 to fix the LED lamp to a support or bracket (not shown). Two lateral fin groups each have five recesses 18 formed therein. Two of the five recesses 18 are respectively located at the front and rear sides of the base 12. The other three recesses 18 are located at a lateral side of the base 12. A middle fin group has two recesses 18 formed at the front and the rear sides of the base 12, respectively.

Figure 5:
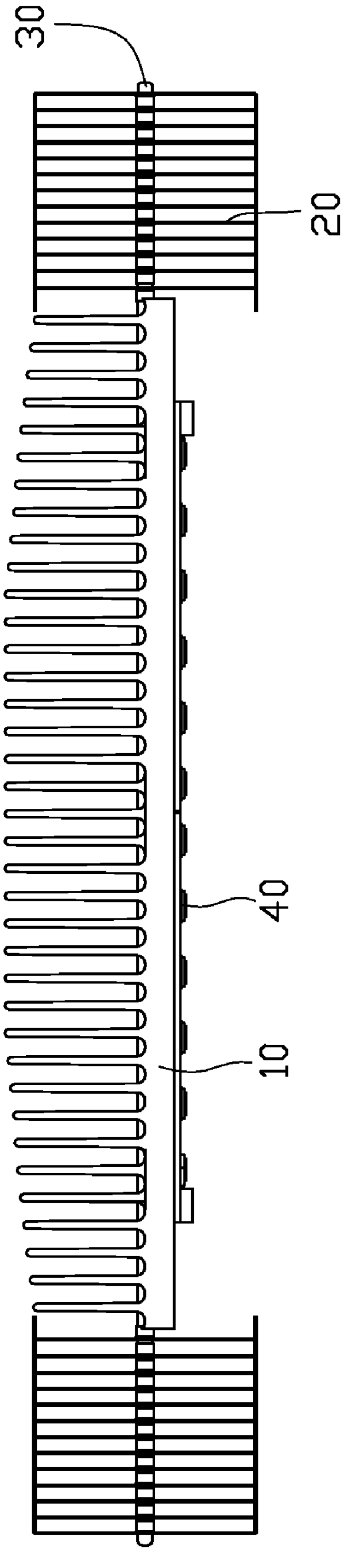
FIG. 5 is a side view of FIG. 1.

The pair of fin sets 20 are positioned to the front and rear side of the heat sink 10 via the four heat pipes 30, to sandwich the heat sink 10 therebetween. Each of the pair of fin sets 20 comprises a plurality of spaced metal sheets 22, each of which has a rectangular shape with a length identical to that of the base 12 of the heat sink 10, and a height larger than that of the heat sink 10. Thus, when the pair of fin sets 20 is fixed to the heat sink 10 as illustrated in FIG. 5, the fin sets 20 can have a top substantially level with the tops of the plurality of fins 14 of the heat sink 10, and a bottom portion extending downwardly beyond the bottom side of the base 12 to be lower than the base 12. Each of the plurality of metal sheets 22 defines four equidistant holes 24 therein, corresponding to the four channels 16 in the heat sink 10, respectively. Four annular flanges 26 are stamped inwardly and horizontally from each of the plurality of metal sheets 22 in a manner that each of the four annular flanges 26 is coincident with and around a corresponding one of the four holes 24. The four annular flanges 26, which extend from each of the plurality of metal sheets 22 connect an adjacent metal sheet 22 at positions where the four holes 24 are defined, respectively, to thereby form four passages (not labeled) in the each one of the pair of fin sets 20. The four heat pipes 30 are engagingly received in the four passages (not labeled), respectively.

Figure 4:
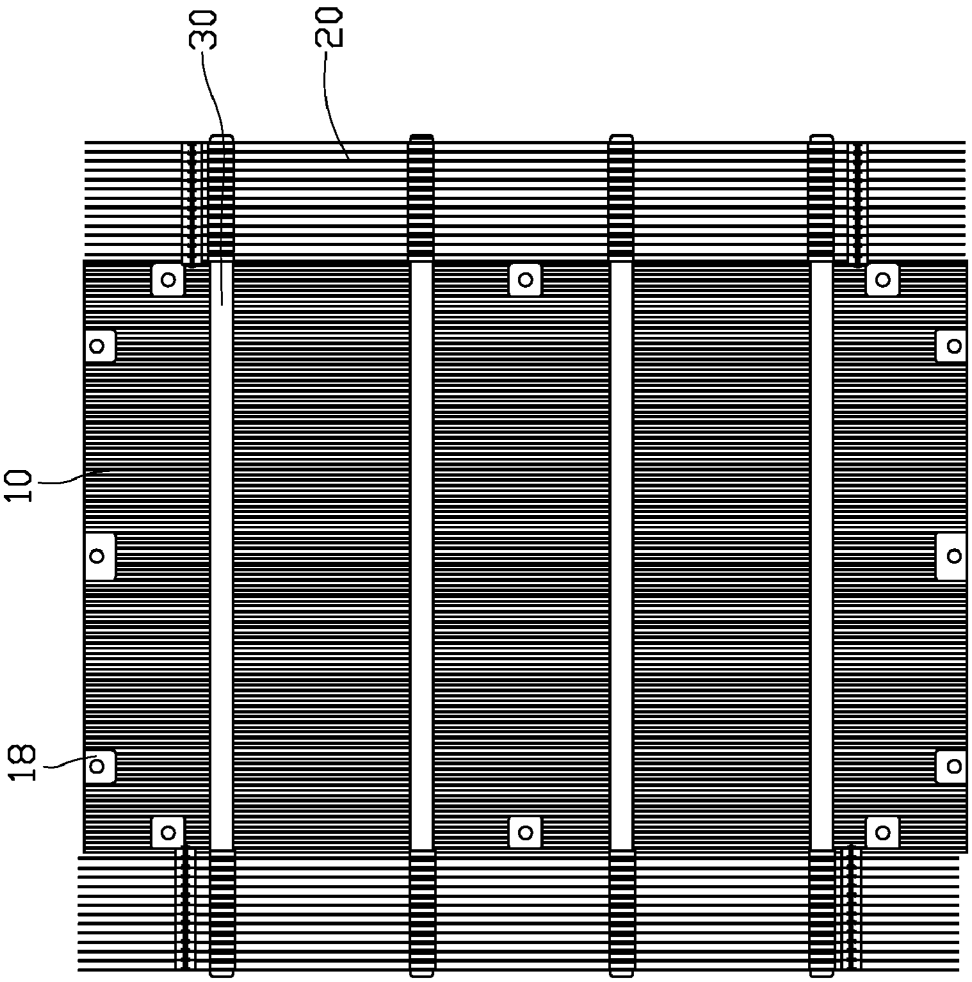
FIG. 4 is a top view of FIG. 1.

Also referring to FIGS. 4-5, each of the four heat pipes 30 is straight and flat with a cross section thereof being approximately rectangular. A length of each of the four heat pipes 30 is larger than a short edge of the base 12, whereby as each of the four heat pipes 30 is retained in a corresponding one of the four channels 16 in the heat sink 10, two opposite ends thereof extend beyond the heat sink 10 to be inserted into two corresponding passages of the pair of fin sets 20, respectively, thereby connecting the pair of fin sets 20 to the heat sink 10.

Shown in FIG. 3, the LED module 40 includes a rectangular printed circuit board 42 and a plurality of LEDs 44 electrically mounted in a matrix manner on a bottom side of the printed circuit board 42. An area of the printed circuit board 42 is less than that of the base 12 of the heat sink 10. The printed circuit board 42 is secured on a central area of the base 12 of the heat sink 10 with a top side thereof contacting the bottom side of the base 12.

In use, when the plurality of LEDs 44 are activated to lighten, heat generated by the plurality of LEDs 44 is conducted to the base 12 of the heat sink 10 via the printed circuit board 42. The heat is transferred to the whole heat sink 10 and the pair of fin sets 20 by the four heat pipes 30 rapidly and sufficiently, thus avoiding local concentrations and an uneven distribution of the heat on the base 12 of the heat sink 10. A part of the heat is dissipated to air located above the heat sink 10 via the plurality of fins 14. Remaining part of the heat is dispersed to air around the pair of fin sets 20, wherein cool air can move from a place below the fins sets 20 through gaps (not labeled) between the spaced metal sheets 22 to a place above the fins sets 20 to thereby efficiently and timely take the heat away from the fin sets 20. Therefore, the heat generated by the plurality of LEDs 44 is able to be dissipated to the ambient air via the heat sink 10 and the pair of fin sets 20 sufficiently and rapidly, with the help of the four heat pipes 30, and the plurality of LEDs 44 can work within their predetermined temperature range, accordingly.

What is claimed is:

1. An LED lamp comprising:
- a heat sink comprising:
  - a rectangular base;
  - a plurality of fins extending from the base;
- an LED module secured on the base;
- a pair of fin sets disposed at two opposite sides of the base to sandwich the heat sink therebetween, wherein each fin set has a lower portion below a bottom of the heat sink; and
- a plurality of heat pipes connecting the heat sink to the pair of fin sets;
- wherein the plurality of fins extends upwardly from a top face of the base, and the LED module is secured on a bottom face of the base;
- wherein a plurality of parallel channels are defined across the plurality of fins to separate the plurality of fins to a plurality of fin groups, the plurality of heat pipes being retained in the plurality of channels, respectively; and
- wherein some of the fins are truncated to define a plurality of recesses, the recesses being located over the top face of the base and near a periphery of the base.

2. The LED lamp as claimed in claim 1, wherein each of the plurality of channels extends through each of the plurality of fins to an upper portion of the base along a height direction of the heat sink, each of the plurality of heat pipes having a lower portion received below the top face of the base.

3. The LED lamp as claimed in claim 2, wherein the each of the plurality of heat pipes has a central portion retained in a corresponding one of the plurality of channels, and two opposite ends inserted into the pair of fin sets, respectively.

4. The LED lamp as claimed in claim 3, wherein the each of the plurality of heat pipes is straight and has a rectangular cross section in compliance with a lower part of the each of the plurality of channels in the base.

5. The LED lamp as claimed in claim 1, wherein each of the pair of fin sets consists of a plurality of equidistantly spaced sheets parallel to the plurality of fins and perpendicular to the plurality of heat pipes.

6. The LED lamp as claimed in claim 5, wherein each of the plurality of sheets has a plurality of holes defined therein and a plurality of annular flanges formed inwardly therefrom corresponding to the plurality of holes, respectively, and corresponding ones of the plurality of annular flanges connect with each other to form a plurality of passages which receive corresponding ends of the plurality of heat pipes therein.

7. The LED lamp as claimed in claim 5, wherein the each of the plurality of sheets has a height larger than that of the heat sink, with top portions of the sheets being approximately level with top portions of the plurality of fins of the heat sink.

8. The LED lamp as claimed in claim 1, wherein an airflow can flow from a place below the fin sets through the fin sets to a place above the fin sets.

9. A heat sink assembly for dissipating heat from an LED module comprising:
- a first heat sink comprising:
  - a planar base adapted for attaching the LED module thereon; and
  - a plurality of fin groups formed on the base and spaced from each other along a first direction, the plurality of fin groups being separated by multiple channels;
- at least a second heat sink juxtaposed with the first heat sink along a second direction perpendicular to the first direction; and
- at least a heat pipe having a portion receivably fitted between two adjacent ones of the plurality of fin groups, and an end extending beyond the first heat sink to be inserted into the at least a second heat sink;
- wherein each of the plurality of fin groups comprises a plurality of fins, the at least a second heat sink has a top substantially level with a top of the first heat sink and a bottom below a bottom of the first heat sink, and the at least a second heat sink has a gap defined through the top and bottom thereof so that air can flow vertically through the at least a second heat sink; and
- wherein some of the fins are truncated to define a plurality of recesses, the recesses being located over the base and near a periphery of the base of the first heat sink.

10. The heat sink assembly as claimed in claim 9, wherein the at least a heat pipe has a lower portion accommodated into the base of the first heat sink, and an upper portion exposed above the base of the first heat sink.

11. An LED lamp comprising:
- a heat sink having a base defining a bottom surface and a top surface; a plurality of fins extending upwardly from the top surface of the base;
- an LED module having a printed circuit board attached to the bottom surface of the base and a plurality of LEDs mounted on the printed circuit board;

first and second fin sets located at opposite lateral sides of the heat sink, respectively, wherein each of the first and second fin sets has a lower portion located below the bottom surface of the base, each of the first and second fin sets has a plurality of sheets defining a plurality of gaps between every two adjacent sheets, and an airflow can flow from a place below the first and second fin sets through the gaps in each of the first and second fin sets to a place above the first and second fin sets;

wherein a plurality of channels are defined across the plurality of fins of the heat sink to separate the plurality of fins into multiple fin groups; and wherein some of the fins are truncated to define a plurality of recesses, the recesses being located over the top surface of the base of the heat sink and near a periphery of the base of the heat sink.

* * * * *